(12) United States Patent
Sugita et al.

(10) Patent No.: US 6,377,337 B1
(45) Date of Patent: *Apr. 23, 2002

(54) PROJECTION EXPOSURE APPARATUS

(75) Inventors: Mitsuro Sugita, Utsunomiya; Akiyoshi Suzuki, Tokyo, both of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/299,558

(22) Filed: Apr. 27, 1999

(30) Foreign Application Priority Data

May 2, 1998 (JP) .......................................... 10-137475

(51) Int. Cl.⁷ .......................... G03B 27/54; G03B 27/42
(52) U.S. Cl. .......................................... 355/67; 355/53
(58) Field of Search .............................. 355/67, 30, 77, 355/53, 55, 68–71; 430/311–394; 250/492.2, 548; 356/399–401

(56) References Cited

U.S. PATENT DOCUMENTS

| | | | | |
|---|---|---|---|---|
| 3,591,252 A | * | 7/1971 | Sun Lu ........................ 350/3.5 |
| 4,402,571 A | * | 9/1983 | Cowan et al. .......... 350/162.17 |
| 4,456,371 A | | 6/1984 | Lin .............................. 355/71 |
| 4,644,170 A | | 2/1987 | Komatsu ................. 250/492.2 |
| 4,902,899 A | | 2/1990 | Lin et al. ................. 250/492.1 |
| 4,947,413 A | * | 8/1990 | Jewell et al. ................. 378/34 |
| 4,997,747 A | * | 3/1991 | Yoshida et al. ............. 430/321 |
| 5,048,967 A | * | 9/1991 | Suzuki et al. ............... 356/401 |
| 5,415,835 A | | 5/1995 | Brueck et al. ............... 430/311 |
| 5,532,090 A | | 7/1996 | Borodovsky .................... 430/5 |
| 5,563,012 A | | 10/1996 | Neisser ......................... 430/22 |
| 5,595,843 A | | 1/1997 | Dao ................................ 430/5 |
| 5,610,684 A | * | 3/1997 | Shiraishi ....................... 355/55 |
| 5,661,548 A | * | 8/1997 | Imai ............................. 355/55 |
| 5,702,868 A | | 12/1997 | Kellam et al. .............. 430/312 |
| 5,705,321 A | | 1/1998 | Brueck et al. .............. 430/316 |
| 5,710,620 A | * | 1/1998 | Taniguchi ..................... 355/53 |
| 5,721,608 A | * | 2/1998 | Taniguchi ..................... 355/53 |
| 5,726,738 A | * | 3/1998 | Sohn et al. ................... 355/53 |
| 5,734,462 A | * | 3/1998 | Sakai ........................... 355/53 |
| 5,796,114 A | * | 8/1998 | Mizutani .................... 250/548 |
| 5,851,707 A | | 12/1998 | Shibuya et al. ................ 430/5 |
| 5,917,580 A | * | 6/1999 | Ebunima et al. ............. 355/53 |
| 5,917,604 A | * | 6/1999 | Dirksen et al. ............... 356/40 |

FOREIGN PATENT DOCUMENTS

| | | |
|---|---|---|
| JP | 7-253649 | 10/1995 |
| JP | 2636700 | 4/1997 |
| JP | 2650962 | 5/1997 |
| JP | 9-199390 | 7/1997 |

* cited by examiner

*Primary Examiner*—Russell Adams
*Assistant Examiner*—Hung Henry Nguyen
(74) *Attorney, Agent, or Firm*—Fitzpatrick, Cella, Harper & Scinto

(57) ABSTRACT

A projection exposure apparatus, having a multiple exposure mode, for projecting a pattern of a mask onto a wafer. In the apparatus, an illumination system illuminates the mask and a projection system supplies into an optical path a filter which blocks a zero-order light beam of diffracted light projected from the mask. An exposure step in the mode of multiple exposure is performed in a state in which the filter has been supplied into the optical path.

8 Claims, 14 Drawing Sheets

1 0 1 0 1 0 1 0 1 0 1

(1) IN THE CASE OF NEGATIVE RESIST (2) IN THE CASE OF POSITIVE RESIST 0 0 0 0 1 1 0 0 0 0

0 0 0 0 2 2 0 0 0 0

0 0 0 2 2 2 0 0 0 0

FIG. 13(A)
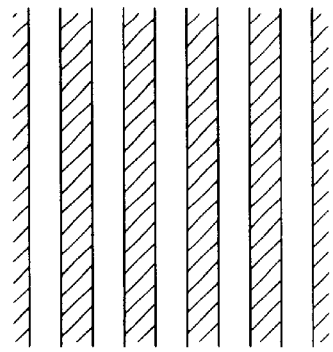
FIG. 13(B)
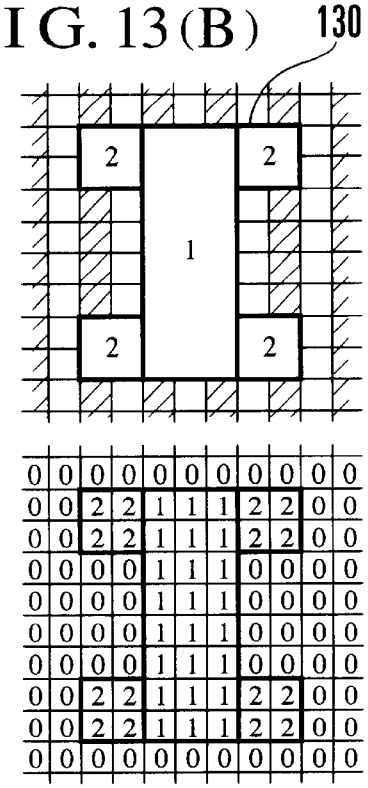
FIG. 13(C)
FIG. 13(D)
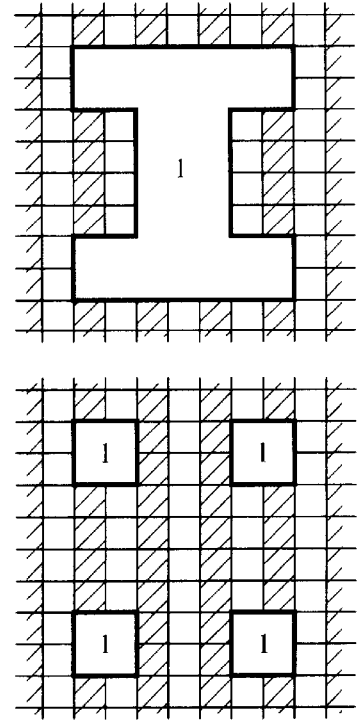

PROJECTION EXPOSURE APPARATUS

BACKGROUND OF THE INVENTION

1. Field of the Invention

The present invention relates to an exposure method and an exposure apparatus for exposing photosensitive substrates, such as silicon plates and glass, to light through patterns designed for devices, such as semiconductors including an IC, an LSI, etc., a liquid crystal panel, a magnetic head, a CCD (image sensor), and so on.

2. Description of the Related Art

In manufacturing an IC, an LSI, a liquid crystal element, etc., by photolithography, a projection exposure apparatus (projection aligner) is employed. The projection exposure apparatus is arranged to perform an exposure by projecting through a projection optical system a pattern of a photomask or a reticle (hereinafter referred to as a "mask") onto a substrate, such as a silicon plate or a glass plate, which is coated with a photoresist or the like (hereinafter referred to as a "wafer" in general).

FIG. 1 schematically illustrates the arrangement of a conventional projection exposure apparatus. In FIG. 1, there are illustrated a KrF excimer laser 191 used as a light source, an illumination optical system 192, illumination light 193, a mask 194, exposure light 195 on the object side, a projection optical system 196, exposure light 197 on the image side, a photosensitive substrate (wafer) 198, and a substrate stage 199 which holds the photosensitive substrate 198.

In the conventional projection exposure apparatus, a laser beam emitted from the excimer laser 191 is led to the illumination optical system 192. At the illumination optical system 192, the laser beam is converted into the illumination light 193 having a light intensity distribution, a luminous distribution, etc., which are predetermined. The illumination light 193 falls on the mask 194. A circuit pattern which is to be eventually formed on the photosensitive substrate 198 is beforehand formed on the mask 194 with chromium or the like. The incident illumination light 193 passes through the mask 194 and is diffracted by the circuit pattern to become the object-side exposure light 195. The projection optical system 196 converts the exposure light 195 into the image-side exposure light 197 to image the circuit pattern on the photosensitive substrate 198 at a predetermined magnification with sufficiently small aberrations. As shown in an enlarged view at the lower part of FIG. 1, the image-side exposure light 197 converges on the photosensitive substrate 198 at a predetermined NA (numerical aperture=sin θ) to form the image there. To have the circuit pattern formed in a plurality of shot areas on the photosensitive substrate 198, the substrate stage 199 is arranged to be movable stepwise to vary the relative positions of the photosensitive substrate 198 and the projection optical system 196.

However, with the conventional projection exposure apparatus using the KrF excimer laser arranged as described above, it is difficult to form a pattern image of a line width not greater than 0.15 μm.

The reason for this difficulty is as follows. The resolution of the projection optical system is limited by a trade-off between an optical resolution and the depth of focus due to the wavelength of the exposure light. The resolution R of the resolving pattern of the projection exposure apparatus and the depth of focus DOF can be expressed by the following Rayleigh's formulas (1) and (2):

$$R = k1 \frac{\lambda}{NA} \quad (1)$$

$$DOF = k2 \frac{\lambda}{NA^2} \quad (2)$$

In the above formulas, λ represents the wavelength of the exposure light, NA represents a numerical aperture indicative of the brightness of the optical system on the light exit side, and k1 and k2 represent constants which are normally between 0.5 and 0.7.

According to the formulas (1) and (2), in order to make the resolution R smaller for a higher degree of resolution, it is necessary either to make the wavelength λ smaller for a shorter wavelength or to make the value NA larger for a higher degree of brightness. At the same time, however, the depth of focus DOF required for a necessary performance of the projection optical system must be kept at least at a certain value. This requirement imposes some limitation on the increase of the brightness value NA.

There is another known exposure method which does not depend on the formulas (1) and (2). FIG. 2 is a schematic diagram for explaining such an exposure method. Referring to FIG. 2, a coherent light beam emitted from a laser beam source 151 is divided by a half-mirror 152 into two light fluxes. Mirrors 153a and 153b are arranged to deflect the two light fluxes respectively at some angles to cause the two light fluxes to join together on a photosensitive substrate 154 in such a way as to form interference fringes there. The photosensitive part of the photosensitive substrate 154 is allowed to sense light according to a distribution of light intensity made by the interference fringes. Then, a periodic protrusion-and-recess pattern is formed according to the distribution of the light intensity by a developing process.

The resolution R obtained by the above exposure method is expressed by the following formula (3), wherein the resolution R is assumed to be the width of each of lines and spaces, i.e., the width of each of the bright and dark parts of the interference fringes, θ represents the angle of incidence on the substrate 154 of the two light fluxes 151a and 151b, and NA=sin θ.

$$R = \frac{\lambda}{4\sin\theta} \quad (3)$$
$$= \frac{\lambda}{4NA}$$
$$= 0.25 \frac{\lambda}{NA}$$

As is understandable by comparing the formulas (3) and (1) with each other, the constant k1 becomes 0.25 (k1=0.25) according to the exposure method shown in FIG. 2. Considering that the value of the constant k1 of the conventional projection exposure method is between 0.5 and 0.7, the resolution obtainable by the exposure method shown in FIG. 2 is more than two times as high as the resolution obtainable by the conventional exposure method. According to the exposure method shown in FIG. 2, assuming that λ is 0.248 μm and NA is 0.6, for example, the resolution R becomes 0.10 μm.

However, the exposure method shown in FIG. 2 presents a serious problem in that a circuit pattern composed of diverse shapes like semiconductor element patterns hardly can be obtained by carrying out an exposure according to that method, because only such a line-and-space pattern that has a uniform pitch over its whole area is obtainable according to the method of making an exposure through the interference of light fluxes as shown in FIG. 2.

This problem can be solved, for example, by a known multiple exposure method whereby the projection exposure by the method of FIG. 1 and the two-light-flux interference exposure by the method of FIG. 2 are alternately made in combination for one and the same area of a photosensitive substrate one after another without carrying out any developing process on the substrate at intervals between these exposures.

However, the two-light-flux interference exposure in the conventional multiple exposure method necessitates either the use of the apparatus shown in FIG. 2, in addition to the projection exposure apparatus, or the use of a special mask such as a phase-shifting mask in using the projection exposure apparatus.

BRIEF SUMMARY OF THE INVENTION

It is an object of the invention to provide a projection exposure apparatus arranged to permit a multiple exposure to be simply carried out.

To attain the above object, in accordance with an aspect of the invention, there is provided a projection exposure apparatus having a multiple exposure mode, which comprises an illumination system and a projection system, the projection system including means for automatically or manually supplying into an optical path a filter which blocks a zero-order light beam among a plurality of light beams coming from a mask illuminated by the illumination system, wherein an exposure step in the multiple exposure mode is performed in a state in which the filter has been supplied into the optical path.

In the projection exposure apparatus according to the above-stated aspect, the filter is arranged to be supplied to a position of a pupil of the projection system or to a neighborhood of the position of the pupil. The mask which is used when the filter is supplied to the position of the pupil of the projection system or to the neighborhood of the position of the pupil has a periodic pattern of a pitch which is two times a value obtained by dividing a pitch (P) of a periodic pattern image to be formed on an image plane by a projection magnification (M) of the projection system.

Further, the exposure step in the multiple exposure mode is performed in such a manner that a first exposure pattern having an exposure amount not exceeding a threshold value of an object to be exposed is formed, an exposure stage different from the exposure step in the multiple exposure mode is performed in such a manner that a second exposure pattern having an exposure amount exceeding the threshold value and an exposure amount not exceeding the threshold value is formed, and the respective exposure amounts are determined in such a manner that a composite exposure pattern formed by combining the first and second exposure patterns is in such a relation to the threshold value that a desired circuit pattern is formed.

The above and other objects and features of the invention will become apparent from the following detailed description of preferred embodiments thereof taken in connection with the accompanying drawings.

BRIEF DESCRIPTION OF THE SEVERAL VIEWS OF THE DRAWINGS

FIGS. 13(A) to 13(D) schematically show exposure patterns formed by a two-light-flux interference exposure process according to a second embodiment of the invention.

DETAILED DESCRIPTION OF THE INVENTION

Hereinafter, preferred embodiments of the invention will be described in detail with reference to the drawings.

Figure 1:
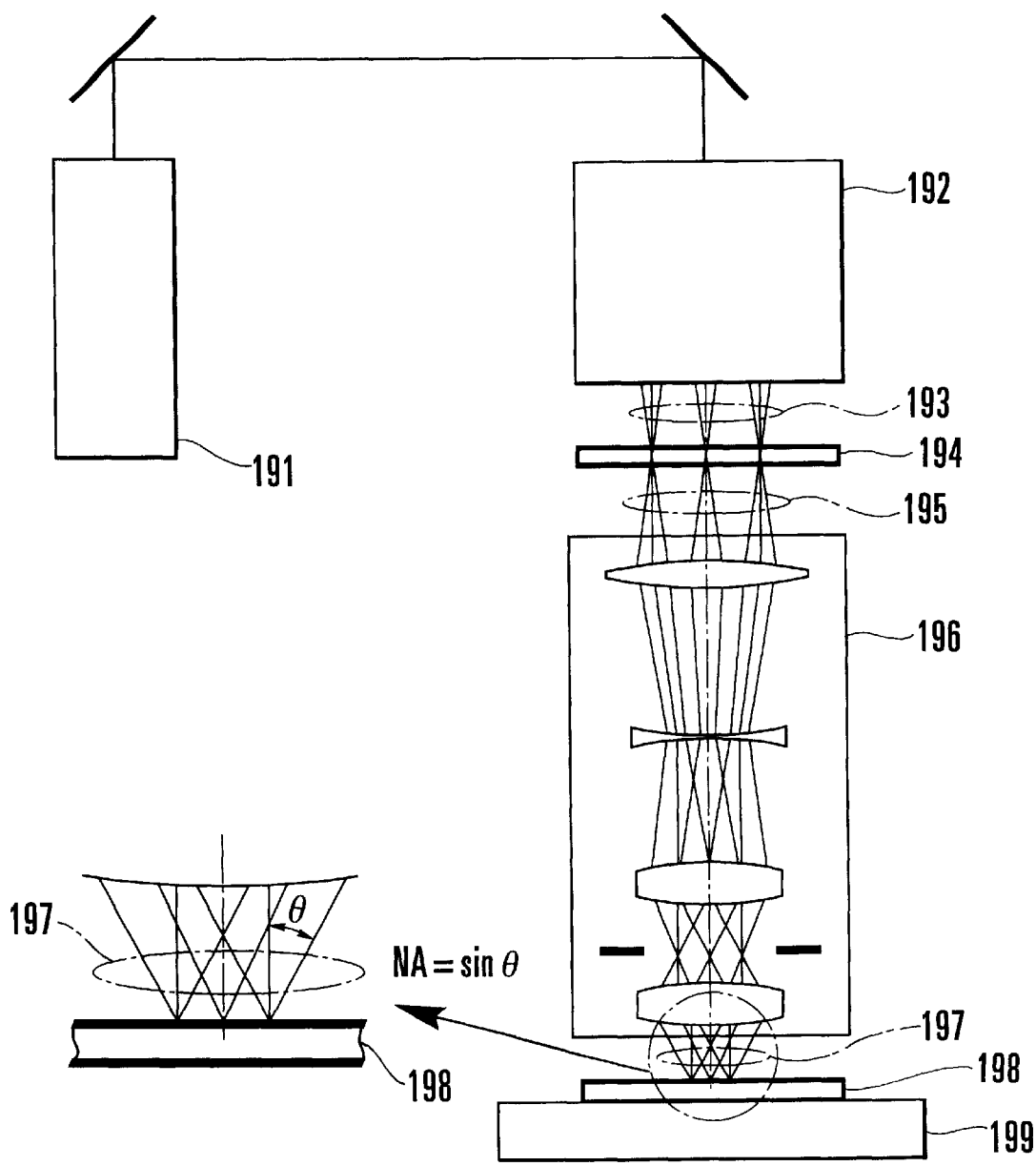
FIG. 1 schematically shows a projection exposure apparatus by way of example.
Figure 2:
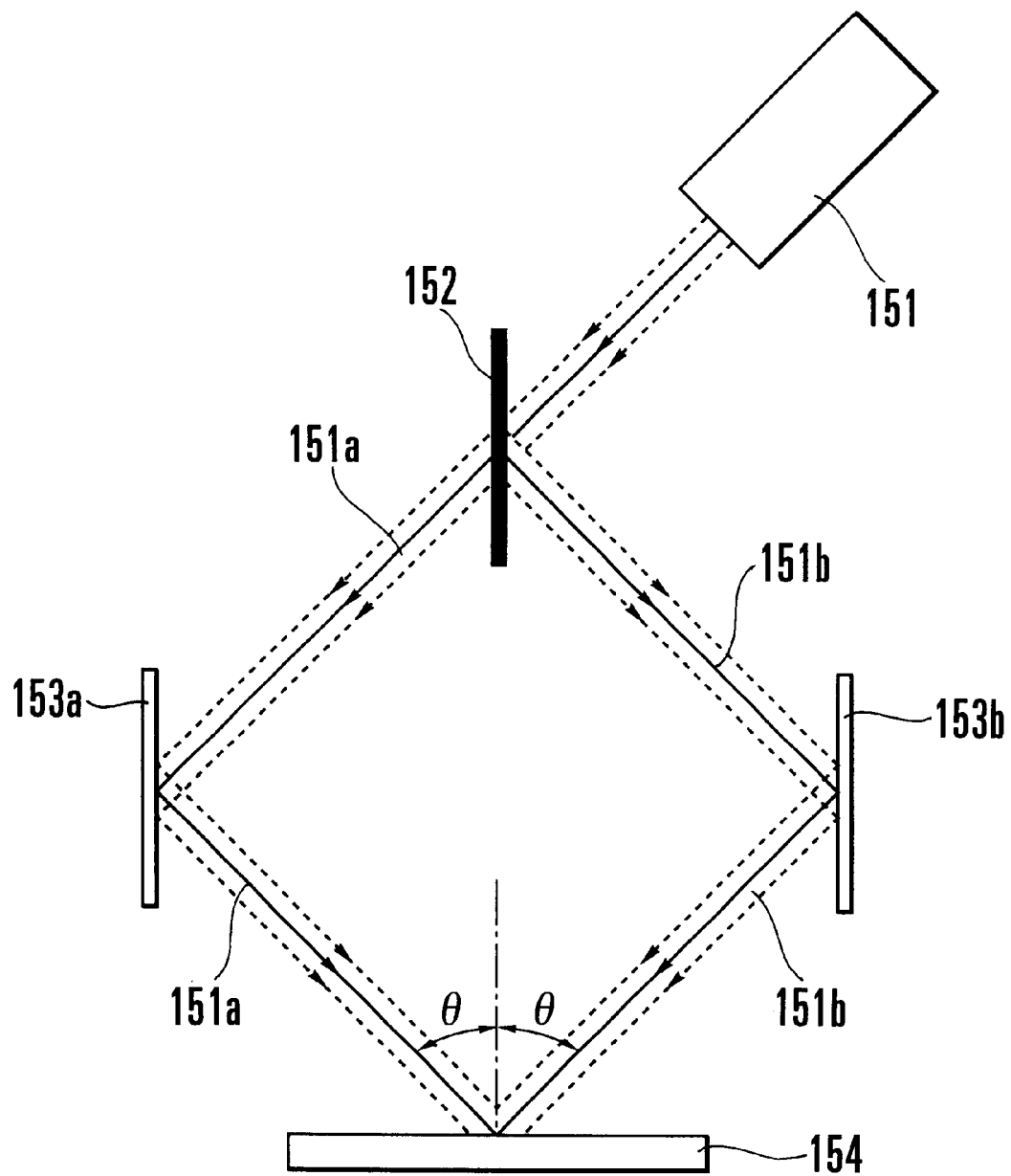
FIG. 2 is a diagram for explaining a two-light-flux interference exposure method.
Figure 3:
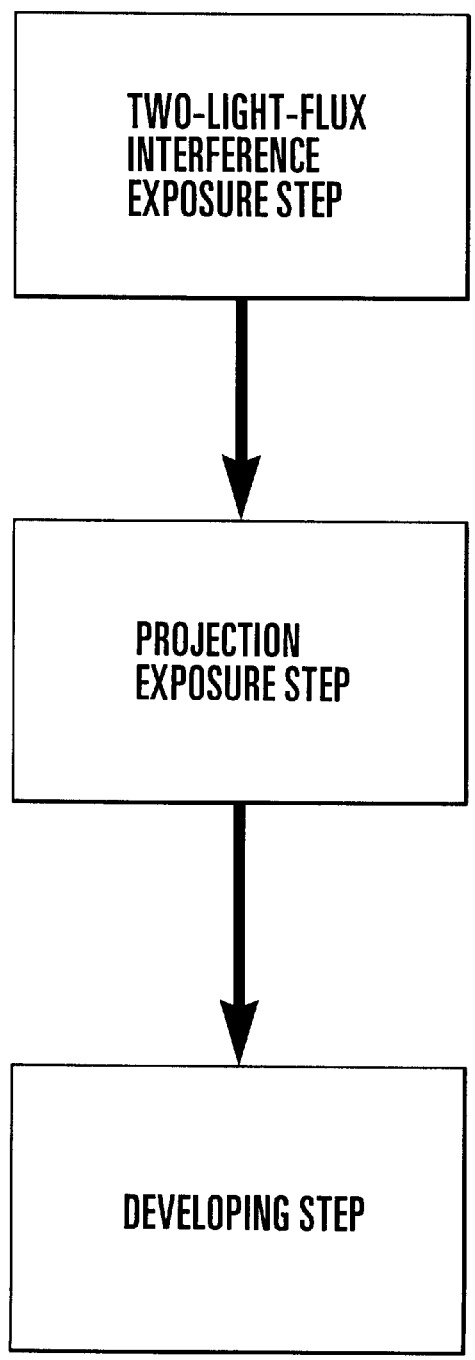
FIG. 3 is a flow chart showing a flow of an exposure method according to the invention.
Figure 11A:
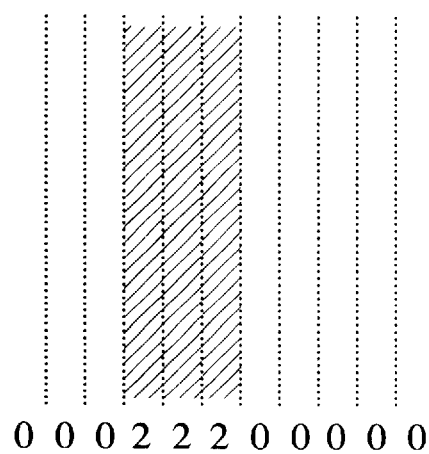
FIGS. 11(A) and 11(B) show still further examples of patterns formed according to the first embodiment.
Figure 11A:
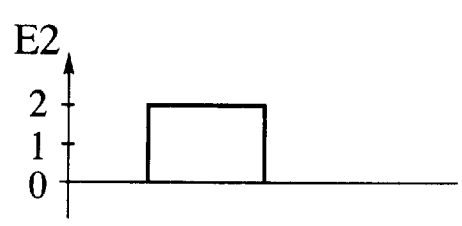
Figure 11B:
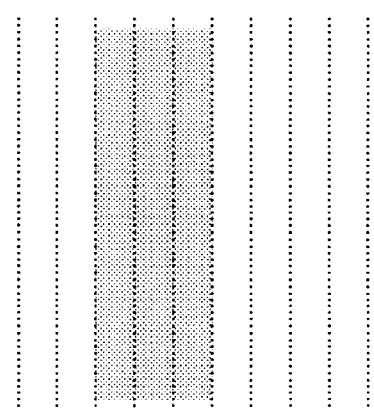
Figure 11B:
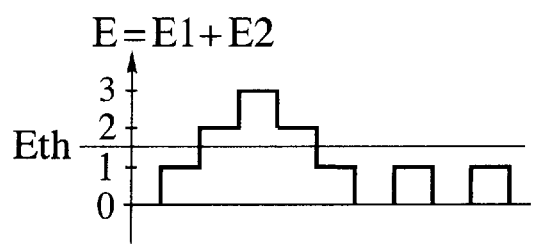

One of multiple exposure methods to which the invention is applied as a first embodiment is first described referring to FIG. 3 and to FIGS. 11(A) and 11(B).

FIG. 3 is a flow chart showing a basic flow of processes of the multiple exposure method. In FIG. 3, there are indicated a two-light-flux interference exposure step and a projection exposure step which constitute a multiple exposure, in addition to a developing step. The sequence of the two-light-flux interference exposure step and the projection exposure step does not have to be as shown in the flow chart of FIG. 3. The projection exposure step may be executed before the two-light-flux interference exposure step. Further, in a case where each of the two-light-flux interference exposure step and the projection exposure step is to be executed a plurality of times, these steps may be alternately executed. Furthermore, some alignment step or the like may be inserted in between the two-light-flux interference exposure step and the projection exposure step for the purpose of enhancing image forming precision. Thus, the structural arrangement according to the invention is not limited by the flow chart of FIG. 3.

Figure 4A:
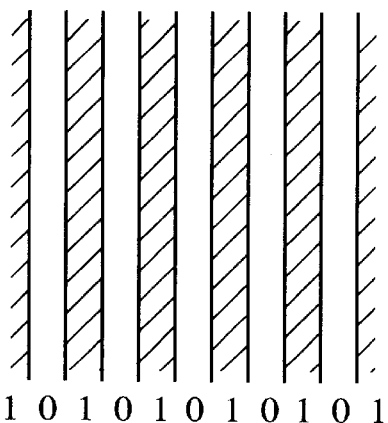
FIGS. 4(A) and 4(B) schematically show exposure patterns obtained in accordance with the two-light-flux interference exposure method.
Figure 4A:
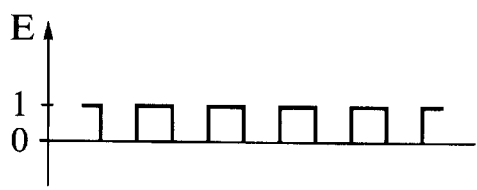
Figure 4B:
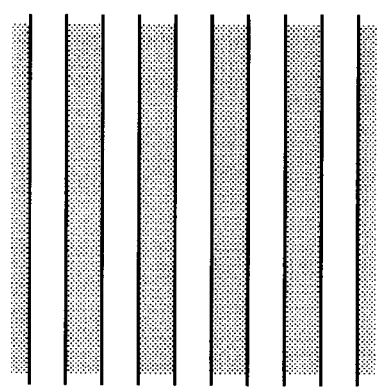
Figure 4B:
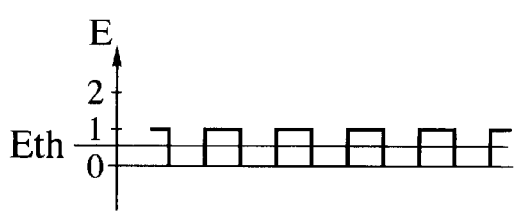

In the case of the multiple exposure shown in the flow chart of FIG. 3, a photosensitive substrate is exposed to the light of a periodic pattern composed of interference fringes brought about by the interference of two light fluxes. FIGS. 4(A) and 4(B) schematically show such a periodic pattern. In FIG. 4(A), each numeral indicates the amount of exposure (exposure amount), and the exposure amount of each of the hatched parts is "0" while that of each of the white parts is "1". In developing the photosensitive substrate exposed with the above periodic pattern, an exposure threshold value Eth of the photosensitive substrate is set at a value between "0" and "1", as shown in FIG. 4(B).

Figure 5A:
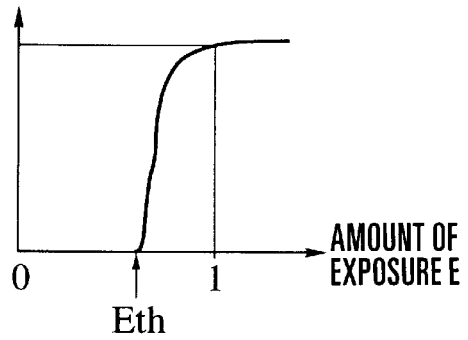
FIGS. 5(A) and 5(B) schematically show exposure sensitivity characteristics of resists.
Figure 5B:
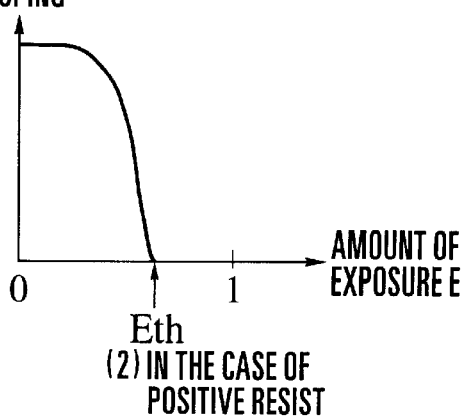

FIGS. 5(A) and 5(B) show the dependency on the exposure amount E of the film thickness "d" after developing of a resist part of the photosensitive substrate and the exposure threshold value Eth for the negative resist and the positive resist, respectively. The film thickness "d" after developing becomes "0" at a portion where the exposure has been made to an exposure amount equal to or greater than the exposure threshold value Eth in the case of the positive resist, or where the exposure has been made to an exposure amount less than the exposure threshold value Eth in the case of the negative resist.

Figure 6:
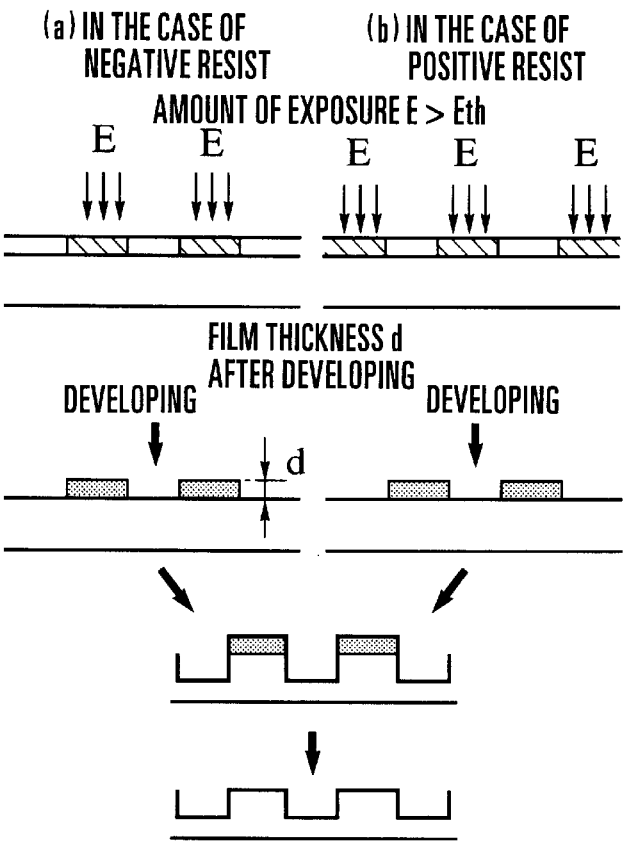
FIG. 6 schematically shows the formation of a pattern by a developing process.

FIG. 6 schematically shows, for each of the positive resist and the negative resist, the manner in which a lithography pattern is formed through developing and etching processes after the above-stated exposure.

Figure 7:
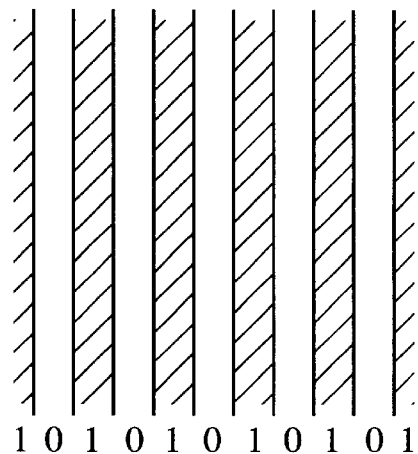
FIG. 7 schematically shows an exposure pattern obtained by the two-light-flux interference exposure.
Figure 7:
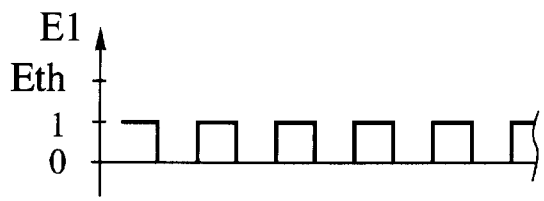

In the case of the multiple exposure as shown in FIG. 3, if a maximum exposure amount is set to "1" for the two-light-flux interference exposure step, the exposure threshold value of the resist is set to a value greater than "1". In the photosensitive substrate as set in the above manner, in a case where an exposure pattern obtained as shown in FIG. 7 by carrying out only the two-light-flux interference exposure is developed, the exposure amount is insufficient, and, although the film thickness somewhat varies, there exists no portion where the film thickness becomes "0", so that no lithography pattern is formed (see FIG. 8). The two-light-flux interference exposure pattern then can be considered to have disappeared. (In the following, the use of a negative resist is described by way of example. However, the invention is of course not limited to the use of the negative type or that of the positive type. Both types of resists are selectively usable as desired in accordance with the invention.)

An advantageous feature of the first embodiment lies in the following point. A high-resolution periodic pattern which seems to disappear if processed by the two-light-flux interference exposure alone is merged with a pattern obtained by the projection exposure. Then, the high-resolution periodic pattern is selectively revived by the above merger and reproduced to form a lithography pattern as desired.

Figure 9A:
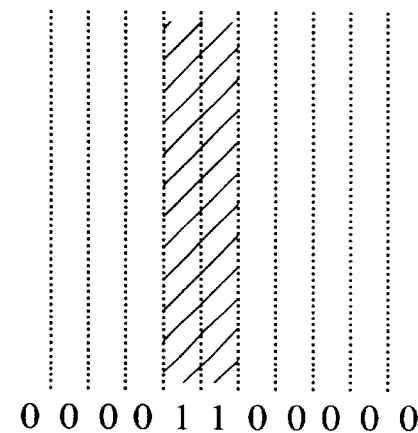
FIGS. 9(A) and 9(B) schematically show, by way of example, patterns formed according to a first embodiment of the invention.
Figure 9A:
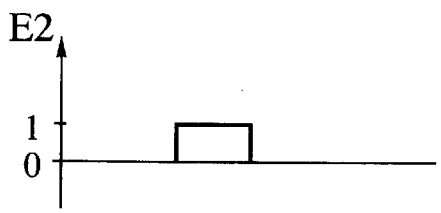

FIG. 9(A) shows a pattern (image) obtained by the projection exposure step. The resolution in the projection exposure step is about half of that in the two-light-flux interference exposure step. Therefore, in the case of FIG. 9(A), the line width of the pattern (image) formed by the projection exposure step is assumed to be about two times as much as a minimum line width obtained by the two-light-flux interference exposure step.

Figure 8:
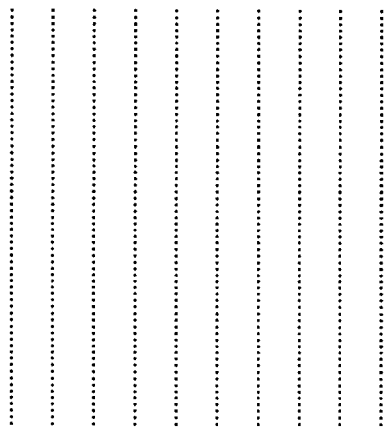
FIG. 8 schematically shows a pattern formed in accordance with the invention.
Figure 8:
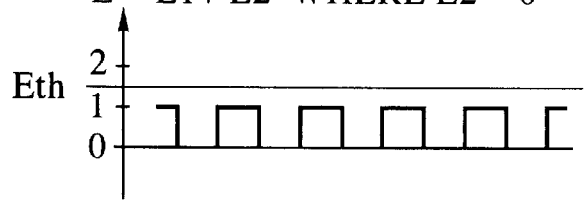
Figure 9B:
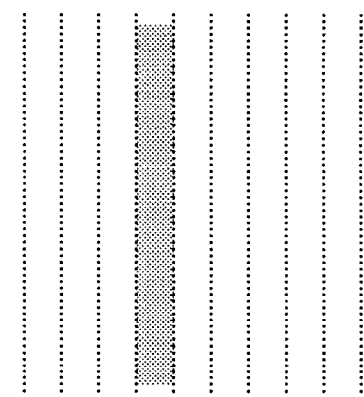
Figure 9B:
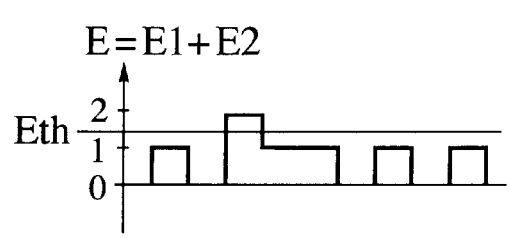

Assuming that the projection exposure step which gives the pattern of FIG. 9(A) is carried on at the same portion after the two-light-flux interference exposure step which gives the pattern of FIG. 7, without executing the developing step, the distribution of the sum of the exposure amounts becomes as shown at the lower part of FIG. 9(B). In this instance, the exposure amount of the two-light-flux interference exposure and that of the projection exposure are in the ratio of 1:1. The exposure threshold value Eth is set between exposure amounts "1" and "2" in the same manner as in the case of FIG. 8 showing the disappearance of the pattern. Therefore, when a developing process is performed after such a double exposure, a lithography pattern is formed as shown at the upper part of FIG. 9(B). This lithography pattern is in relief (protrusive pattern) in the case of the negative resist and in intaglio (recessed pattern) in the case of the positive resist. The thus-obtained lithography pattern has the same resolution as that in the two-light-flux interference exposure, and is not a periodic pattern but an isolated pattern. Thus, this multiple exposure gives a pattern which is of such a high resolution that is higher than a resolution attainable by the projection exposure and which is not attainable by carrying out the two-light-flux interference exposure alone.

Figure 10A:
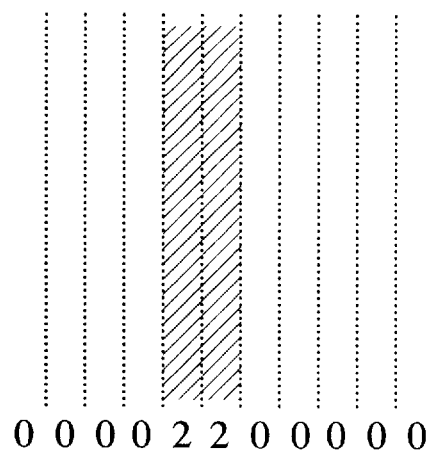
FIGS. 10(A) and 10(B) schematically show other examples of patterns formed according to the first embodiment.
Figure 10A:
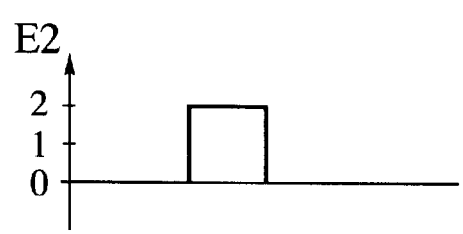
Figure 10B:
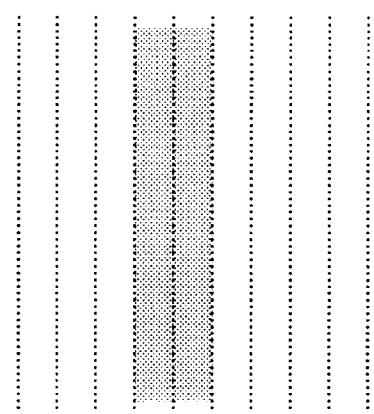
Figure 10B:
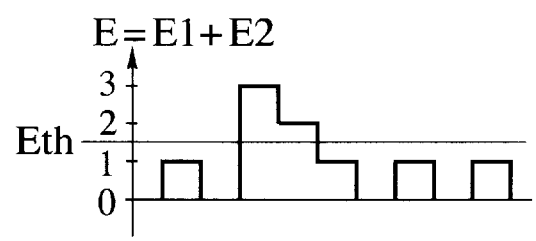

FIG. 10(A) shows a case where the projection exposure is carried out with a pattern of a line width twice as large as the above-stated line width and at an exposure amount which is greater than the exposure threshold value Eth (an exposure amount two times as much as the exposure threshold value Eth in this case). After that, when the developing process is carried out, a pattern obtained by the two-light-flux interference exposure disappears leaving only a lithography pattern formed by the projection exposure, as shown at the upper part of FIG. 10(B)

FIGS. 11(A) and 11(B) show a case where the projection exposure is carried out with a pattern of a line width three times as large as the smallest line width for the two-light-flux interference exposure. As shown, the result of this exposure is also the same as in the case of FIGS. 10(A) and 10(B). As is apparent from the above, any projection exposure with a pattern of a larger line width can be likewise carried out by basically combining the twofold line width and the threefold line width, so that all of the patterns attainable by the projection exposure can be formed.

The first embodiment is arranged, as described above, to carry out the two-light-flux interference exposure and the projection exposure in combination. In carrying out the exposures, the exposure amount of each exposure is adjusted appositely to the exposure threshold value Eth of the resist of the photosensitive substrate. Any of various lithography patterns such as those shown in FIGS. 9(B), 10(B) and 11(B) can be formed in such a way as to have its smallest line width become the resolution attainable by the two-light-flux interference exposure.

The above multiple exposure method according to the first embodiment is recapitulated as follows.

(i) Any part of the pattern of the two-light-flux interference exposure step where the total exposure amount obtained after the projection exposure step is less than the exposure threshold value is caused to disappear by the developing process.

(ii) As regards the pattern areas where the exposure is effected by the projection exposure step at an exposure amount less than the exposure threshold value, parts of the pattern where the total of the exposure amounts obtained by the projection exposure step and the two-light-flux interference exposure step exceeds the exposure threshold value Eth are selectively brought about to have a lithography pattern formed by the developing process in such a way as to give the resolution attainable by the two-light-flux interference exposure.

(iii) The areas of the pattern at which an exposure is made by the projection exposure step at an exposure amount greater than the exposure threshold value are included as they are in the lithography pattern formed by the developing process.

The depth of focus obtained at the two-light-flux interference exposure step is fairly large and is, therefore, advantageous in forming a pattern. Further, the sequence of the two-light-flux interference exposure and the projection exposure may be conversely arranged.

The first embodiment of the invention is further described with reference to FIG. 19.

Figure 19:
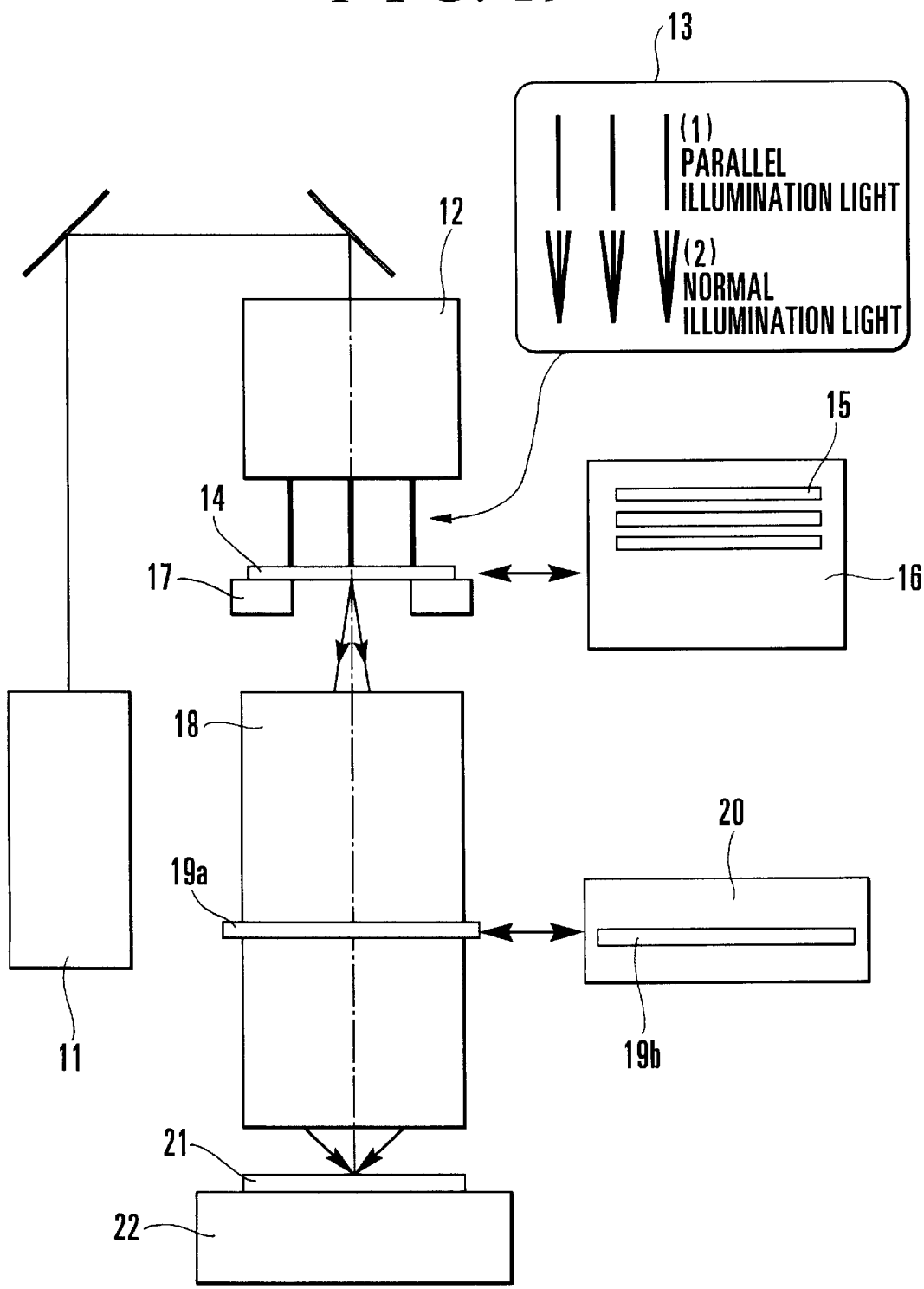
FIG. 19 schematically shows essential parts of a projection exposure apparatus according to the invention.

FIG. 19 schematically shows the exposure method and the exposure apparatus arranged to make an exposure according to the invention. In FIG. 19, reference numeral 11 denotes an exposure light source such as a KrF excimer laser or an ArF excimer laser, or the like. The wavelength of the exposure light does not exceed 400 nm and is arranged, for example, to be 248 nm or 193 nm. In FIG. 19, there are further illustrated an illumination optical system 12, a schematic representation 13 of illumination modes, a mask 14, a mask 15 which is arranged to be replaced with the mask 14, a mask changer 16, a mask stage 17, a projection optical system 18, pupil filters 19a and 19b, a filter changer 20 arranged to have the pupil filters 19a and 19b either automatically or manually replaced with each other, a wafer 21, and a wafer stage 22.

In the exposure apparatus, in a case where the two-light-flux interference exposure, which is capable of a projection exposure at a high resolution, is to be made, a filter which has a light blocking area at its center, i.e., the filter 19a, is used and a coherent illumination which has parallel or approximately parallel light fluxes perpendicularly incident on a mask to make the so-called "σ" small is applied to the mask which is an ordinary mask having a repeating pattern as will be further described later herein.

Further, in a case where an ordinary projection exposure is to be made, the illumination is switched over to a partly coherent illumination having a relatively large "σ", the pupil filter 19a is either switched over to the filter 19b or is retracted without using the other filter 19b, and the mask 14 is replaced with a mask having a different pattern.

In carrying out the two-light-flux interference exposure with the exposure apparatus shown in FIG. 19, the pupil filter 19a and the mask 14 are arranged as follows.

Figure 17:
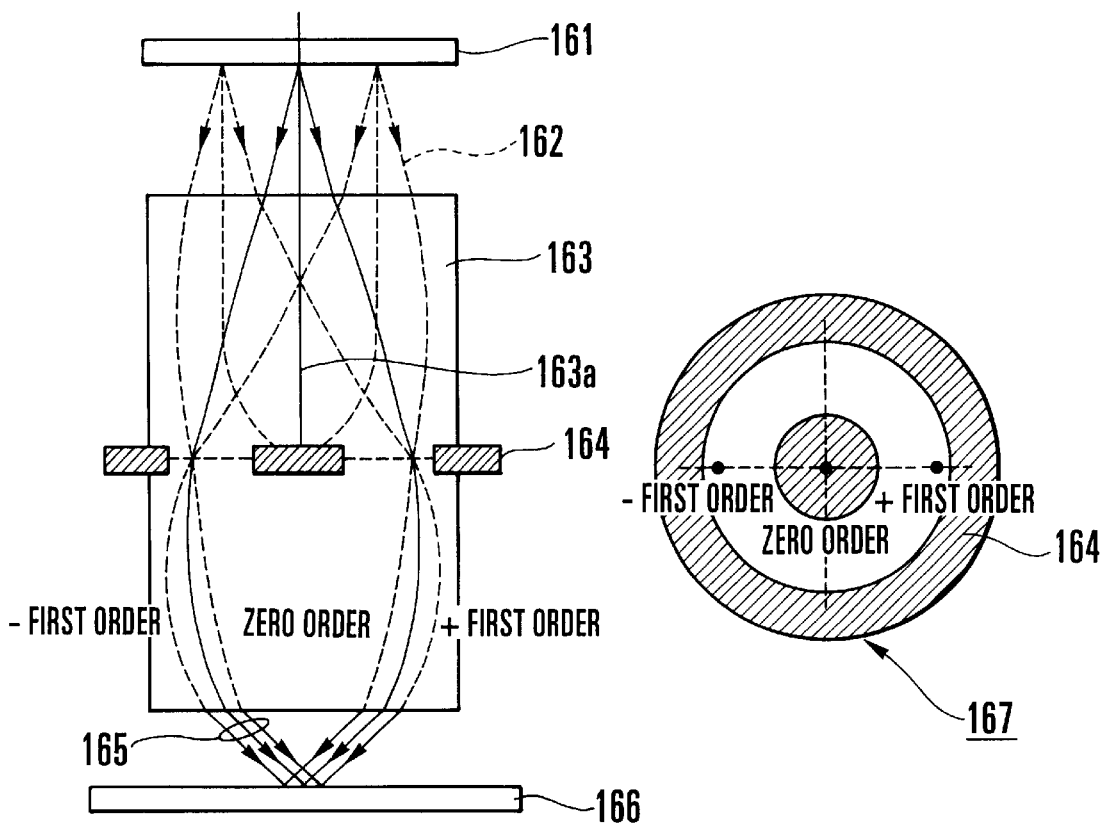
FIG. 17 schematically shows a two-light-flux interference exposure made according to the invention.

FIG. 17 shows the projection exposure apparatus having a projection optical system composed of, for example, a refraction system. In the projection exposure apparatus, a design wavelength is 248 nm and the numerical aperture NA is not less than 0.6. In FIG. 17, there are illustrated a mask 161, exposure light on the object side 162, the projection optical system 163, a pupil filter 164, exposure light on the image side 165, a photosensitive substrate (wafer) 166, and a schematic view 167 showing the position of the light fluxes on the pupil plane, in which hatched parts indicate light blocking parts of the pupil filter 164. In FIG. 17, the projection exposure apparatus is shown as in a process of making a two-light-flux interference exposure. As shown in FIG. 17, the object-side exposure light 162 and the image-side exposure light 165 are composed of three pairs of parallel light fluxes and two pairs of parallel light fluxes, respectively.

Figure 18:
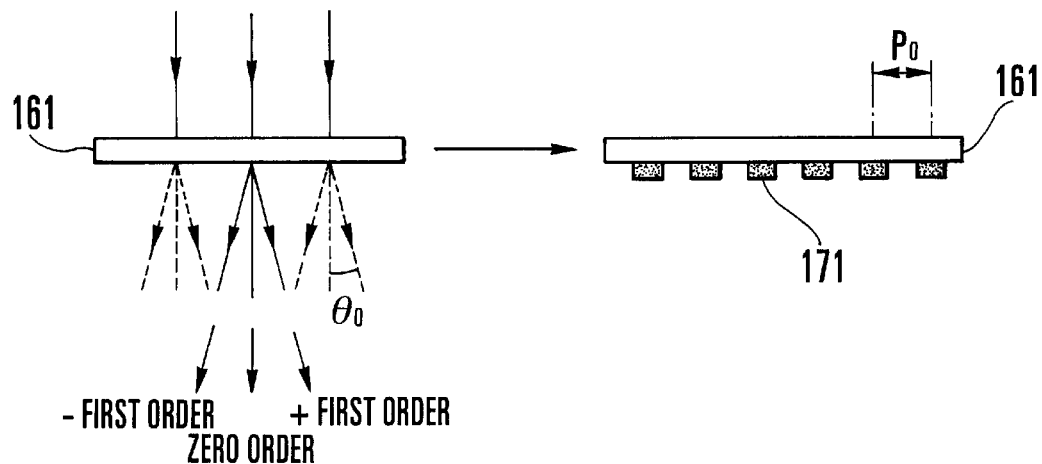
FIG. 18 schematically shows a mask and an illumination method according to the invention.

In order to carry out the two-light-flux interference exposure in an ordinary projection exposure apparatus, the mask and the illumination on the mask are arranged, according to the invention, as shown in FIG. 18.

Referring to the right part of FIG. 18, the mask 161 has a pattern of a one-dimensional period in which light blocking parts 171 made of chromium are formed at a pitch Po, which is expressed as follows:

$$Po = \frac{2P}{M} = \frac{4R}{M} = \frac{\lambda}{M \cdot NA} \quad (4)$$

where R represents the resolution, Po represents the pitch of arrangement of the light blocking parts 171 on the mask 161, P represents the pitch of a periodic pattern image obtained on the photosensitive substrate 166, M represents the magnification of the projection optical system 163, λ represents the wavelength, and NA represents the numerical aperture NA of the projection optical system obtained on the image side.

As shown on the left part of FIG. 18, the mask 161 is nearly perpendicularly illuminated in an almost coherent manner. Under the coherent illumination, light having passed through the mask 161, which falls on the projection optical system 163, includes a zero-order light flux which rectilinearly travels, a − first-order light flux which travels in the direction of an angle −θo and a + first-order light flux in the direction of an angle +θo. The − first-order light flux and the + first-order light flux travel on the two sides of the zero-order light flux symmetrically with respect to the optical axis 163a of the projection optical system 163. In this case, the pupil filter 164 is retractably arranged in the neighborhood of the pupil (an aperture stop) of the projection optical system 163 to remove the zero-order light flux so as to prevent the zero-order light flux from contributing to image formation.

With the projection exposure apparatus arranged in this manner, the two-light-flux interference exposure step shown in FIG. 3 is executed. Then, the multiple exposure can be carried out according to the invention by using the same projection exposure apparatus. Further, the use of the + and − first-order light fluxes, according to this method, permits the mask to be arranged to have a periodic pattern at a pitch which is twice as large as the pitch of the conventional mask arrangement. Besides, the multiple exposure method according to the invention obviates the necessity of attaching a fine phase film to a mask like in the case of a Levenson-type mask. The above method is, therefore, advantageous also with respect to the production of masks.

Figure 12:
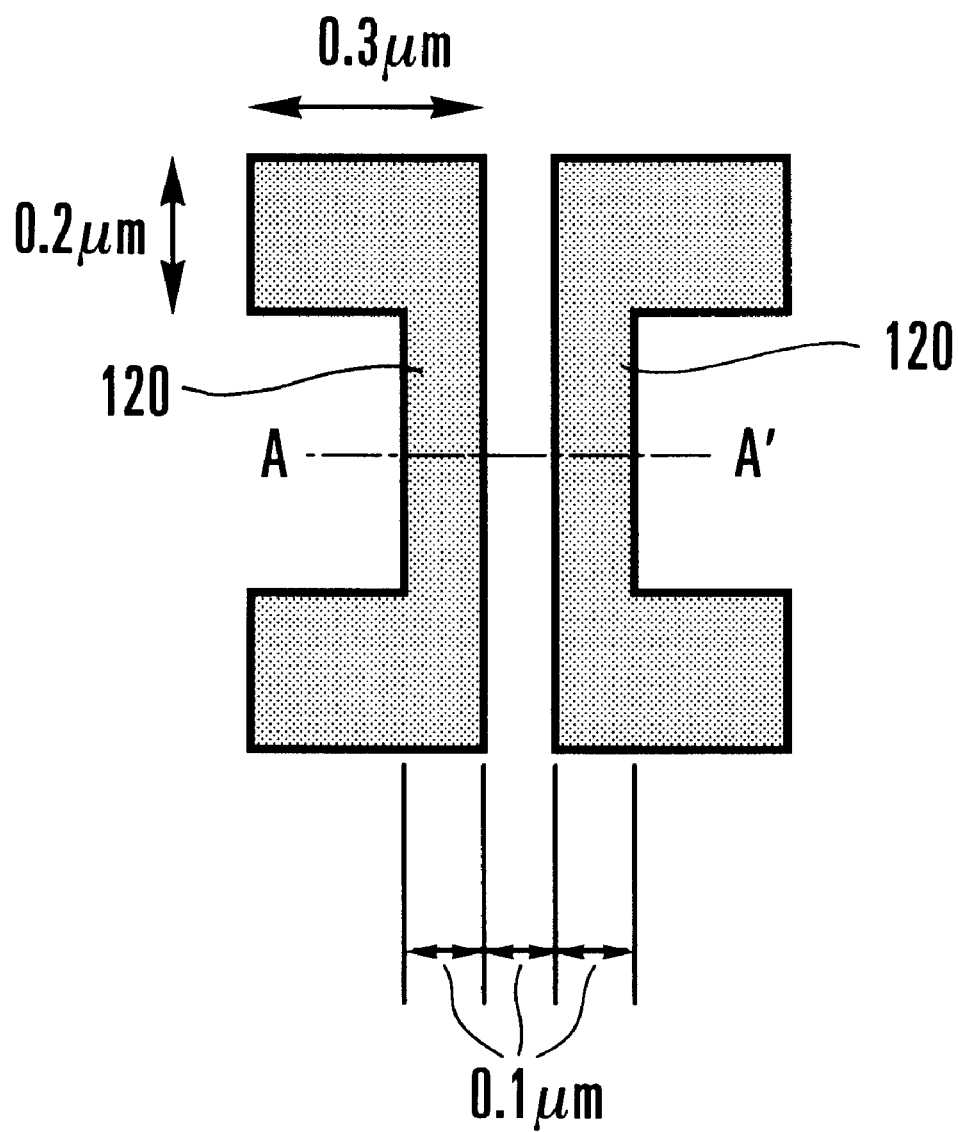
FIG. 12 schematically shows a typical circuit pattern.

A second embodiment of the multiple exposure method of the invention is next described with reference to FIG. 12 and FIGS. 13(A) to 13(D). In the case of the second embodiment, a circuit pattern to be obtained by the exposure is a so-called gate-type pattern which is as shown in FIG. 12. In the gate-type pattern, the smallest line width in the horizontal direction, i.e., in the direction of a line A–A', is 0.1 μm, while the smallest line width in the vertical direction is 0.2 μm.

In this case, the two-light-flux interference exposure step which gives a high resolution pattern is applied only to a vertical pattern 120, which necessitates the high resolution.

FIG. 13(A) shows a one-dimensional periodic exposure pattern (distribution of image intensity or exposure amount) obtained by the two-light-flux interference exposure. The period of the one-dimensional periodic exposure pattern is 0.2 μm, which corresponds to a periodic pattern image of 0.1 μm L&S (line and space). The periodic pattern image is prepared by using the projection exposure apparatus provided with the zero-order-light-cutting pupil filter shown in FIGS. 17 to 19 and an ordinary line-and-space mask pattern. Numerals "0" and "1" shown at the lower part of FIG. 13(A) indicate the amounts of exposure (exposure amounts).

After the two-light-flux interference exposure step, an exposure is made with an exposure pattern 130 shown in FIG. 13(B) as the projection exposure. This projection exposure is made also by using the projection exposure apparatus shown in FIG. 19. The upper part of FIG. 13(B) shows a positional relation between the exposure pattern of the two-light-flux interference exposure and the exposure pattern of the projection exposure, and an amount of exposure obtained at each of different areas by the projection exposure step. At the lower part of FIG. 13(B), the exposure amounts obtained by the projection exposure step are shown in a state of being mapped by the resolution of 0.1 μm pitch.

As is understandable from FIG. 13(B), the smallest line width of the exposure pattern of the projection exposure is 0.2 μm, which is twice as large as that of the exposure pattern of the two-light-flux interference exposure.

Further, another method of carrying out the projection exposure to give the exposure pattern wherein the exposure amount varies with the area of the pattern uses a mask which is arranged as follows. The mask has a plurality of stepped (multiple) transmission factors including aperture parts of a transmission factor T% corresponding to the areas indicated by "1" in FIG. 13(B) and aperture parts of a transmission factor 2T% corresponding to the areas indicated by "2" in FIG. 13(B). By this method, the projection exposure can be finished by carrying it out only once. In this case, a ratio among the exposure amounts obtained on the photosensitive substrate by the respective exposure steps is as follows: "two-light-flux interference exposure":"projection exposure at the aperture part of transmission factor T":"projection exposure at the aperture part of transmission factor 2T"= 1:1:2.

Other types of masks arranged to give exposure patterns in which the exposure amount varies with the area of the pattern include a mask which has an aperture part analogous to the gate pattern shown in FIG. 12. In this case, the image of the vertical pattern 120 which has the smallest line width cannot be resolved and, therefore, has a smaller exposure amount than other parts. As a result, there is obtained an exposure pattern which resembles the pattern shown at the upper part of FIG. 13(B).

Further, there is another method in which an exposure is made twice by using masks of two kinds which give exposure patterns of predetermined exposure amounts as shown at the upper and lower parts of FIG. 13(D). In the case of this method, since it is sufficient to have one step of an exposure amount, the masks can be arranged in an ordinary manner to have only one step of a transmission factor. The ratio among the exposure amounts obtained on the photosensitive substrate in this case is as follows: "two-light-flux interference exposure":"projection exposure for the first time":"second projection exposure for the second time"= 1:1:1.

The formation of a lithography pattern by the above-stated combination of the two-light-flux interference exposure and the projection exposure is next described as follows. In the case of such a multiple exposure, since there is no developing step arranged between the two-light-flux interference exposure and the projection exposure, the exposure amount of the exposure pattern obtained by one exposure step is added to that of the exposure pattern obtained by the other exposure step. After the addition, an exposure pattern is newly formed showing a distribution of exposure amounts and that of latent image intensity.

The exposure pattern obtained as a result of the addition of the exposure amounts of the two different exposure steps in the second embodiment is shown at the upper part of FIG. 13(C). The lower part of FIG. 13(C) shows, in a gray tone, a lithography pattern obtained by developing the exposure pattern shown at the upper part of FIG. 13(C). Further, in the case of the second embodiment, the exposure threshold value Eth of the photosensitive substrate used is not less than "1" and not greater than "2". The lithography pattern is formed in relief (protrusive pattern) in the case of a negative resist and in intaglio (recessed pattern) in the case of a positive resist.

The lithography pattern shown in gray at the lower part of FIG. 13(C) coincides with the gate pattern shown in FIG. 12, so that it is understandable that this pattern can be formed by the exposure method of the second embodiment.

Figure 16:
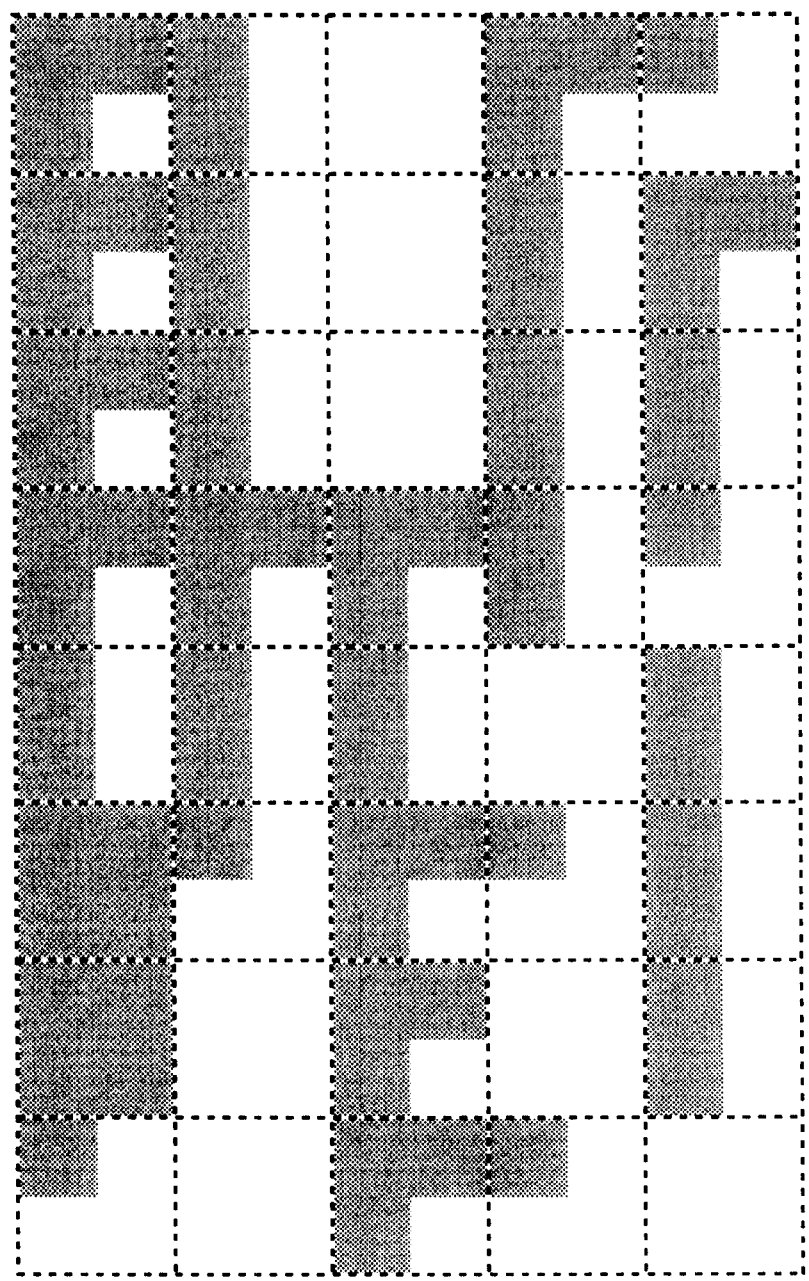
FIG. 16 schematically shows by way of example a pattern which can be formed according to the third embodiment.

A third embodiment of the invention is next described below with reference to FIGS. 14, 15 and 16.

In the case of the third embodiment, also, the invention is applied to the projection exposure apparatus having the zero-order-light cutting pupil filter described with reference to FIGS. 17 to 19, and a two-dimensional periodic pattern is formed by the two-light-flux interference exposure step. FIG. 14 schematically shows a two-dimensional exposure pattern obtained by the two-light-flux interference exposure, as a map of exposure amounts. To increase the possible variations of the final exposure pattern, the third embodiment is arranged to cause the exposure amounts of the interference fringes (periodic patterns) which are respectively obtained in the two different directions (X and Y directions) by the two-light-flux interference exposure step to differ from each other. More specifically, the exposure amount in one of the two directions is arranged to be twice as large as the exposure amount in the other direction. Incidentally, the exposure amounts in the two directions, however, may be arranged to be the same as each other.

Figures 14, 15:
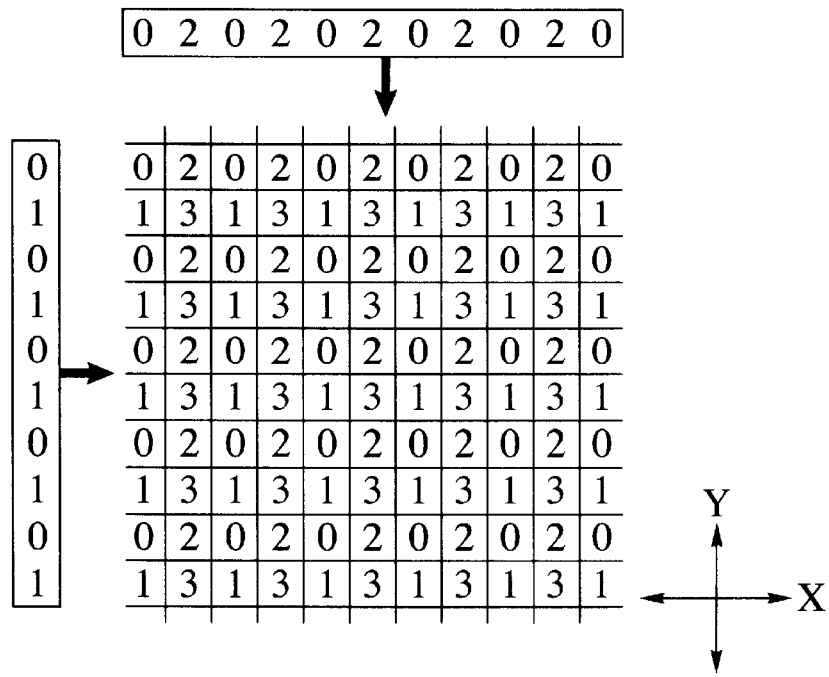
FIG. 14 schematically shows an exposure pattern formed by a two-light-flux interference exposure process according to a third embodiment of the invention.
FIG. 15 schematically shows a pattern formed by two-dimensional blocks.

In the exposure pattern shown in FIG. 14, as a result of the two-light-flux interference exposure step, the amounts of exposure obtained on the resist in the two directions X and Y are of four stepped values. In order to bring about a sufficient effect over the two-light-flux interference exposure, the number of steps of exposure amounts of the projection exposure must be at least five. In addition to that, the exposure threshold value of the resist applied to the photosensitive substrate is set at a value greater than "3" which is the largest exposure amount of the two-light-flux interference exposure and is less than "4" which is the largest exposure amount of the projection exposure.

With the projection exposure thus carried out at exposure amounts which are divided by five steps ("0", "1", "2", "3" and "4"), the exposure amounts of an exposure pattern obtained as a result of the projection exposure are shown in FIG. 15. In FIG. 15, gray parts represent parts having exposure values equal to or above the exposure threshold value, which parts become an exposure pattern that is finally converted by the developing process into a lithography pattern.

Further, in the case of FIG. 15, the resolution obtained by the projection exposure step is assumed to be one half of that of the two-light-flux interference exposure step, and the exposure pattern of the projection exposure is shown in blocks as having a side length two times as long as that of the blocks of the two-light-flux interference exposure. FIG. 16 shows an example in which an exposure pattern is formed to cover a wider area by varying the exposure amount of the projection exposure, taking the blocks as the units of variation. In the case of FIG. 16, the exposure pattern is replete with variations and not only has the resolution of the two-light-flux interference exposure but also includes a pattern other than the periodic pattern.

In the third embodiment, the projection exposure step is executed using blocks of a side length twice as long as that of the two-light-flux interference exposure step. However, the invention is of course not limited to this arrangement. According to the invention, the projection exposure step can be executed at any desired line width within the limit of resolution of the projection exposure to obtain a corresponding exposure pattern in combination with the two-light-flux interference exposure step.

The line width of the two-light-flux interference exposure in the third embodiment, as described above, is arranged to be the same in the two directions. However, the arrangement may be changed to have the line width in one direction different from the line width in the other direction. Further, an angle between the two directions, i.e., an angle formed by the two kinds of interference fringes, can be decided as desired.

The invention is not limited to the embodiments described above. The sequence of the multiple exposure, the details of the structure of the pupil filter, etc., are variable as desired within the spirit and scope of the invention.

Particularly, the number of times of exposure and the number of steps of exposure amounts of the two-light-flux interference exposure step and the projection exposure step are adjustable and selectable as desired. Further, the manner in which the exposures are overlapped with each other is adjustable by shifting exposure positions as desired. A circuit pattern thus can be variously formed by such an adjustment. Further, the invention is not limited to the multiple exposure described above. The invention is applicable also to various known multiple exposure processes which include an exposure step of carrying out a two-light-flux interference exposure by using a mask and a projection exposure apparatus.

Next, a method for manufacturing a semiconductor device with the projection exposure apparatus arranged according to the invention in the multiple exposure mode described in the foregoing as one of a plurality of exposure modes is described by way of example below.

Figure 20:
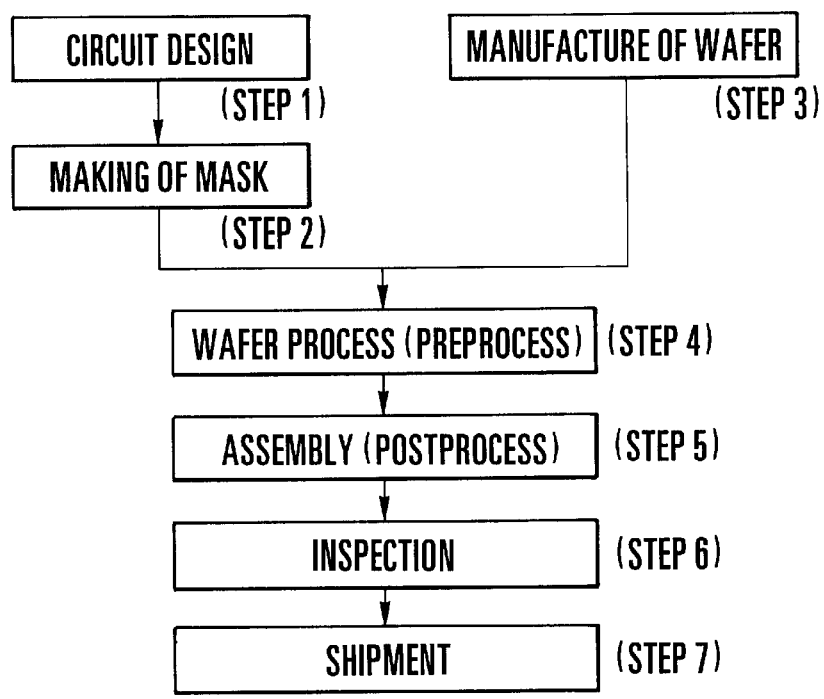
FIG. 20 is a flow chart showing a flow of the manufacturing process for semiconductor devices according to the invention.

FIG. 20 is a flow chart showing a flow of processes for manufacturing a semiconductor device, such as a semiconductor chip of an IC or an LSI, a liquid crystal panel, a CCD or the like.

At a step 1 (circuit design), a circuit design for the semiconductor device is performed. At a step 2 (making of mask), a mask on which the designed circuit pattern is formed is made.

At a step 3 (manufacture of wafer), a wafer is manufactured by using a material such as silicon. At a step 4 (wafer process, called a preprocess), an actual circuit is formed on the wafer, by the lithography technique, using the mask and the wafer.

At a step 5 (assembly, called a post process), the wafer obtained at the step 4 is processed into a semiconductor chip through an assembly process (dicing and bonding), a packaging process (chip sealing), etc.

At a step 6 (inspection), the semiconductor device obtained at the step 5 is inspected by carrying out tests for its operation, its durability, etc. At a step 7, the semiconductor device thus completed through the above tests is shipped.

Figure 21:
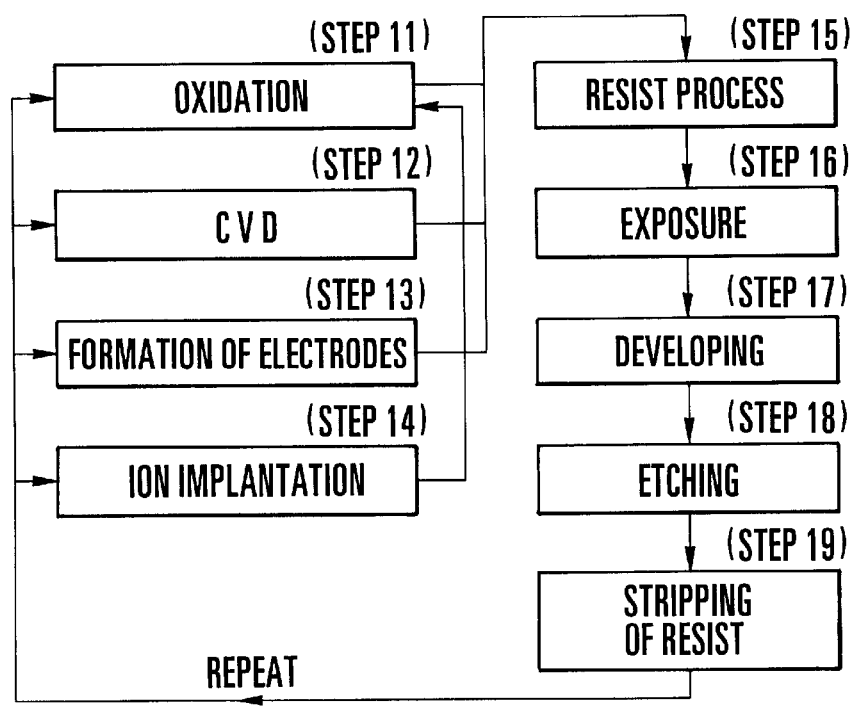
FIG. 21 is a flow chart showing also a flow of the manufacturing process for semiconductor devices according to the invention.

FIG. 21 is a flow chart showing the details of the above-stated wafer process. At a step 11 (oxidation), the surface of the wafer is oxidized. At a step 12 (CVD), an insulation film is formed on the surface of the wafer.

At a step 13 (formation of electrodes), electrodes are formed on the wafer by a vapor deposition process. At a step 14 (ion implantation), ions are implanted into the wafer. At a step 15 (resist process), a photosensitive material is coated on the wafer. At a step 16 (exposure), the circuit pattern of the mask is applied to the wafer by carrying out a baking exposure with the projection exposure apparatus described in the foregoing.

At a step 17 (developing), the exposed wafer is developed. At a step 18 (etching), parts other than the developed resist are scraped off. At a step 19 (stripping of resist), the resist which becomes unnecessary after the etching process is removed. With the above steps repeated, a multiple circuit pattern is formed on the wafer.

The manufacturing method described above permits the manufacture of a semiconductor device of a high degree of integration, which has been difficult to attain by the conventional manufacturing method.

What is claimed is:

1. A projection exposure apparatus, having a mode of multiple exposure, for projecting a pattern of a mask onto a wafer, said apparatus comprising:

an illumination system for illuminating the mask; and a projection system including means for supplying into an optical path a filter which blocks a zero-order light beam of diffracted light projected from the mask, wherein said apparatus performs a first exposure in the mode of multiple exposure at a portion of the wafer in a state in which the zero-order light beam is blocked by said filter, and a second exposure in the mode of multiple exposure at a portion of the wafer in a state in which the zero-order light beam is not blocked, the second exposure following the first exposure, free of a developing process in between the exposures.

2. A projection exposure apparatus according to claim 1, wherein said filter is supplied to a position of a pupil of said projection system or proximate to the position of the pupil.

3. A projection exposure apparatus according to claim 2, wherein the mask which is used when said filter is supplied to the position of the pupil of said projection system or proximate to the position of the pupil has a periodic pattern of a pitch which is two times a value obtained by dividing a pitch (P) of a periodic pattern image to be formed on an image plane by a projection magnification (M) of said projection system.

4. A projection exposure apparatus according to claim 3, wherein the exposure step in the mode of multiple exposure is performed in such a manner that a first exposure pattern having an exposure amount not exceeding a threshold value of an object to be exposed is formed, an exposure step different from the exposure step in the mode of multiple exposure is performed in such a manner that a second exposure pattern having an exposure amount exceeding the threshold value and an exposure amount not exceeding the threshold value is formed, and the respective exposure amounts are determined in such a manner that a composite exposure pattern formed by combining the first and second exposure patterns is in such a relation to the threshold value that a desired circuit pattern is formed.

5. A semiconductor-device manufacturing method for manufacturing a semiconductor device, comprising a step of printing a device pattern onto an object to be exposed, by using a projection exposure apparatus according to one of claims 1 to 4.

6. A projection exposure apparatus, having a mode of multiple exposure, for projecting a pattern of a mask onto a wafer, said apparatus comprising:

an illumination system for illuminating the mask; and a projection system including means for supplying into an optical path a filter which blocks a zero-order light beam of diffracted light projected from the mask, wherein said apparatus performs a first exposure in the mode of multiple exposure in a state in which the zero-order light beam is blocked by said filter, and a second exposure in the mode of multiple exposure in a state in which the zero-order light beam is not blocked, and wherein the exposure step in the mode of multiple exposure is performed in such a manner that a first exposure pattern having an exposure amount not exceeding a threshold value of an object to be exposed is formed, an exposure step different from the exposure step in the mode of multiple exposure is performed in such a manner that a second exposure pattern having an exposure amount exceeding the threshold value and an exposure amount not exceeding the threshold value is formed, and the respective exposure amounts are determined in such a manner that a composite exposure pattern formed by combining the first and second exposure patterns is in such a relation to the threshold value that a desired circuit pattern is formed.

7. A projection exposure apparatus according to claim 6, wherein said filter is supplied to a position of a pupil of said projection system or proximate to the position of the pupil.

8. A projection exposure apparatus according to claim 7, wherein the mask which is used when said filter is supplied to the position of the pupil of said projection system or proximate to the position of the pupil has a periodic pattern of a pitch which is two times a value obtained by dividing a pitch (P) of a periodic pattern image to be formed on an image plane by a projection magnification (M) of said projection system.

* * * * *

UNITED STATES PATENT AND TRADEMARK OFFICE
CERTIFICATE OF CORRECTION

PATENT NO. : 6,377,337 B1
DATED : April 23, 2002
INVENTOR(S) : Mitsuro Sugita et al.

It is certified that error appears in the above-identified patent and that said Letters Patent is hereby corrected as shown below:

<u>Title page,</u>
Under FOREIGN PATENT DOCUMENTS, -- JP  6-333795  12/1994 -- should be inserted.

<u>Column 5,</u>
Line 17, ""0"" should read -- "1" --.
Line 18, ""1,"" should read -- "0" --.

<u>Column 8,</u>
Line 50, "like in" should read -- as in --.

Signed and Sealed this

Twenty-fourth Day of September, 2002

Attest:

JAMES E. ROGAN
Attesting Officer
Director of the United States Patent and Trademark Office